US011899158B2

(12) United States Patent
Reiderman

(10) Patent No.: US 11,899,158 B2
(45) Date of Patent: Feb. 13, 2024

(54) LOGGING TOOL MOTION ERROR REDUCTION FOR NUCLEAR MAGNETIC RESONANCE LOGGING VIA PULSE SUB-SEQUENCES

(71) Applicant: Halliburton Energy Services, Inc., Houston, TX (US)

(72) Inventor: Arcady Reiderman, Richmond, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 17/693,598

(22) Filed: Mar. 14, 2022

(65) Prior Publication Data

US 2023/0288601 A1 Sep. 14, 2023

(51) Int. Cl.
 *G01V 3/32* (2006.01)
 *G01R 33/44* (2006.01)
 *G01N 24/08* (2006.01)
 *G01R 33/561* (2006.01)
 *G01R 33/50* (2006.01)

(52) U.S. Cl.
 CPC .............. *G01V 3/32* (2013.01); *G01N 24/081* (2013.01); *G01R 33/448* (2013.01); *G01R 33/50* (2013.01); *G01R 33/5616* (2013.01)

(58) Field of Classification Search
 CPC ...... G01V 3/32; G01N 24/081; G01R 33/448; G01R 33/50; G01R 33/5616
 See application file for complete search history.

(56) References Cited

U.S. PATENT DOCUMENTS

| 6,163,153 A | 12/2000 | Reiderman et al. |
| 6,268,726 B1 | 7/2001 | Prammer et al. |
| 6,297,632 B1 | 10/2001 | Speier |

(Continued)

FOREIGN PATENT DOCUMENTS

| WO | 2017123721 | 7/2017 | |
| WO | WO-2019135752 A1 * | 7/2019 | ......... E21B 47/0025 |

OTHER PUBLICATIONS

"PCT Application No. PCT/US2022/078080, International Search Report and Written Opinion", dated Feb. 9, 2023, 11 pages.

(Continued)

*Primary Examiner* — Rishi R Patel
(74) *Attorney, Agent, or Firm* — DeLizio, Peacock, Lewin & Guerra, LLP

(57) ABSTRACT

In some embodiments, a method includes generating at least a first pulse sub-sequence comprising a number of refocusing pulses at a first flip angle and generating at least a second pulse sub-sequence comprising a number of refocusing pulses at a second, lower flip angle. The method further includes detecting, by a nuclear magnetic resonance (NMR) sensor of a logging tool positioned in a wellbore formed in a subsurface formation, NMR spin-echo signals generated in response to at least the first pulse sub-sequence to acquire a first dataset of transversal NMR relaxation data, detecting, by the NMR sensor, NMR spin-echo signals generated in response to at least the second pulse sub-sequence to acquire a second dataset of transversal NMR relaxation data, and determining a property of the subsurface formation based on the first and second datasets of transversal NMR relaxation data.

20 Claims, 9 Drawing Sheets

(56) References Cited

U.S. PATENT DOCUMENTS

| | | | |
|---|---|---|---|
| 6,429,654 B1 | 8/2002 | Itskovich et al. | |
| 6,459,263 B2 | 10/2002 | Hawkes et al. | |
| 6,566,874 B1 | 5/2003 | Speier et al. | |
| 6,624,629 B1* | 9/2003 | Speier | G01R 33/4608 |
| | | | 324/303 |
| 6,690,167 B2 | 2/2004 | Reiderman et al. | |
| 6,844,728 B2* | 1/2005 | Speier | G01N 24/081 |
| | | | 324/303 |
| 6,891,369 B2 | 5/2005 | Hurlimann et al. | |
| 7,180,287 B2 | 2/2007 | Rottengatter et al. | |
| 7,268,547 B2 | 9/2007 | Kruspe et al. | |
| 7,339,374 B2 | 3/2008 | Blanz | |
| 7,358,725 B2 | 4/2008 | Blanz | |
| 8,941,383 B2 | 1/2015 | Hopper et al. | |
| 2002/0153887 A1* | 10/2002 | Taicher | G01N 24/081 |
| | | | 324/303 |
| 2003/0020473 A1 | 1/2003 | Speier et al. | |
| 2003/0071617 A1 | 4/2003 | Kruspe et al. | |
| 2003/0132749 A1 | 7/2003 | Speier et al. | |
| 2004/0032258 A1 | 2/2004 | Blumich | |
| 2005/0030021 A1 | 2/2005 | Prammer et al. | |
| 2008/0024128 A1 | 1/2008 | Song et al. | |
| 2013/0234704 A1 | 9/2013 | Huerlimann et al. | |
| 2015/0061664 A1 | 3/2015 | Reiderman et al. | |
| 2020/0088904 A1 | 3/2020 | Dementyev et al. | |

OTHER PUBLICATIONS

De Andrade, et al., "Qualitative analysis by online nuclear magnetic resonance using Carr-Purcell-Meiboom-Gill sequence with low refocusing flip angles", Talanta, vol. 84 Issue 1, Mar. 15, 2011, 5 pages.

"PCT Application No. PCT/US2022/078082, International Search Report and Written Opinion", dated Apr. 19, 2023, 12 pages.

* cited by examiner

LOGGING TOOL MOTION ERROR REDUCTION FOR NUCLEAR MAGNETIC RESONANCE LOGGING VIA PULSE SUB-SEQUENCES

BACKGROUND

The disclosure generally relates to the field of well logging of subsurface formations, and in particular, nuclear magnetic resonance (NMR) logging for formation evaluation.

In the field of logging (e.g., wireline logging, logging while drilling (LWD) and measurement while drilling (MWD)), nuclear magnetic resonance (NMR) tools have been used to perform formation evaluation of subsurface formations. Some downhole NMR tools include a magnet assembly that produces a static magnetic field and a coil assembly that generates radio frequency (RF) control signals and detects magnetic resonance phenomena in the subsurface material. Properties of the subsurface formation can be identified from the detected phenomena.

However, downhole NMR sensors can have a relatively small radial extent of the sensitivity area, thereby making NMR well logging data sensitive to lateral (radial) motion of the tool on which the sensors are mounted. The radial extent of the sensitivity volume can be increased by employing higher power RF pulses that are shorter (excite a broader band). However, there may be an insufficient power downhole to provide the higher power necessary. In applications of NMR logging while drilling (LWD), the lateral motion (vibration) along with rotation may cause severe distortion of the NMR data and can incur an inability to acquire a spin echo signal representing a transversal NMR relaxation. While rotational sensitivity may be reduced or eliminated by designing an axially-symmetrical sensor, the longitudinal and lateral displacement due to tool motion/vibration remains a challenge, especially in LWD and MWD applications.

BRIEF DESCRIPTION OF THE DRAWINGS

Embodiments of the disclosure may be better understood by referencing the accompanying drawings.

DESCRIPTION

The description that follows includes example systems, methods, techniques, and program flows that embody aspects of the disclosure. However, it is understood that this disclosure may be practiced without these specific details. For instance, this disclosure refers to reducing tool motion effects on nuclear magnetic resonance (NMR) logging in illustrative examples. In other instances, well-known instruction instances, protocols, structures and techniques have not been shown in detail in order not to obfuscate the description.

Example embodiments can include NMR logging during various drilling operations for formation evaluation. As further described below, example embodiments can provide more accurate NMR measurements with a reduced cost and increase reliability of an NMR logging tool. Some embodiments can enable transversal ($T_2$) relaxation measurements in an LWD or MWD NMR logging tool. Example embodiments can include correction of error caused by motion (e.g., lateral) of the tool that can occur during NMR logging.

Example embodiments can reduce motion effects of NMR logging data by using a flip angle of the refocusing radio frequency (RF) pulses in relation to a possible level of displacement of the NMR logging tool. In some implementations, selection of the flip angle of refocusing pulses can be in relation to an estimated lateral motion error. In some implementations, at least two Carr Purcell Meiboom Gill (CPMG) sub-sequences having different flip angles of the refocusing pulses can be used. At least one sub-sequence can have a lower flip angle to increase accuracy of measuring longer relaxation components of the NMR relaxation spectrum in the presence of lateral motion of the tool. In some implementations, the flip angle of refocusing pulses in the CPMG sequence can be selected to be substantially equal to a tip angle of an excitation RF pulse, wherein the tip angle is selected to be equal or smaller than 90 degrees.

Example System

Figure 1:
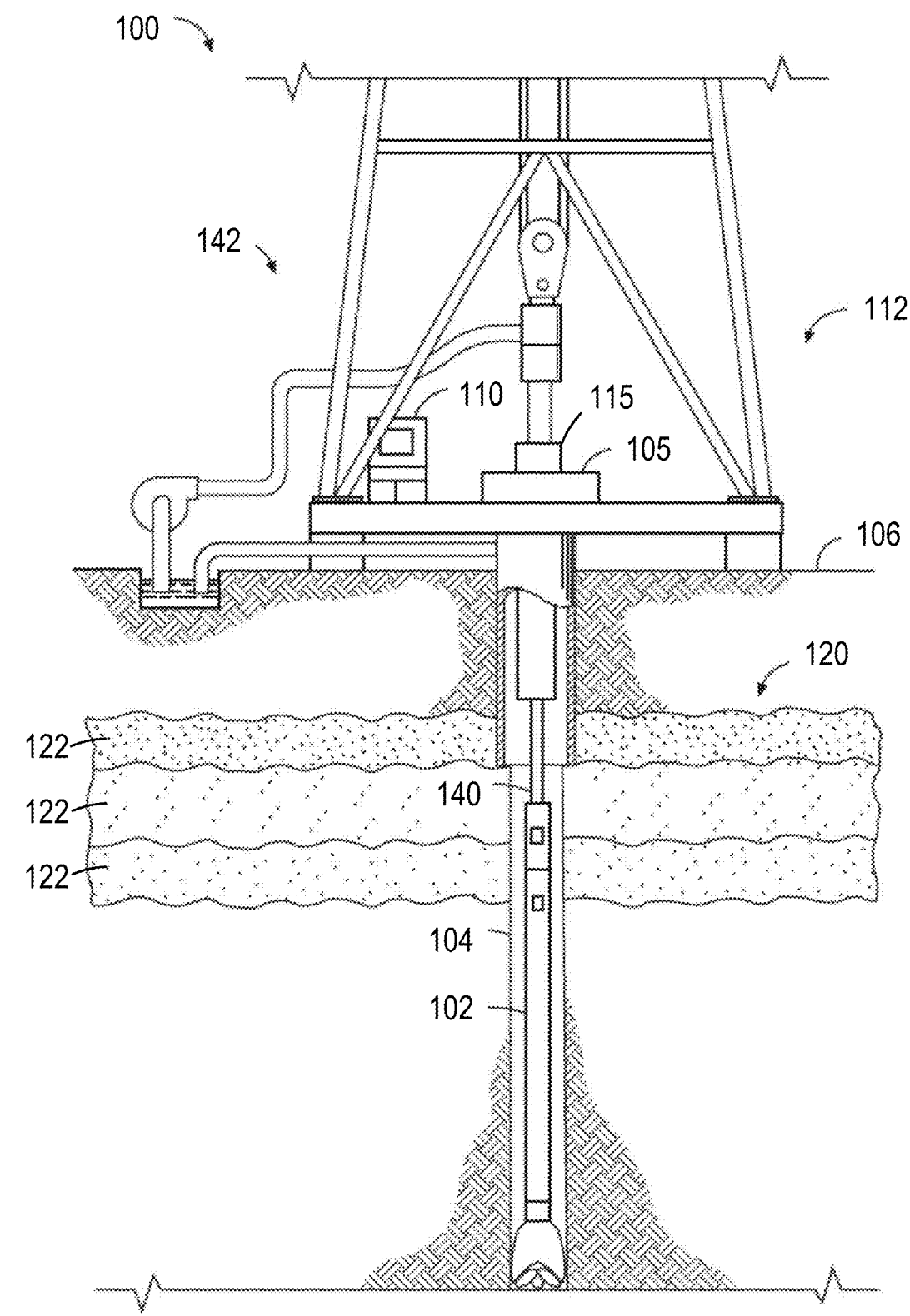
FIG. 1 depicts an example drilling system that includes NMR logging, according to some embodiments.

FIG. 1 depicts an example drilling system that includes NMR logging, according to some embodiments. An example drilling system 100 includes a logging tool 102 disposed on a drill string 140 within a wellbore 104 formed in a subsurface formation 120 comprising subsurface zones 122 beneath a ground surface 106. The drilling system 100 can include additional or different features that are not shown in FIG. 1. For example, the drilling system 100 may include additional drilling system components.

Drilling is commonly carried out using a string of drill pipes connected together to form the drill string 140 that is lowered into the wellbore 104. In some embodiments, the drill string 140 can be lowered through a kelly bushing 115 and a rotary table 105 into the wellbore 104. In some cases, a drilling rig 142 at the surface 106 supports the drill string 140, as the drill string 140 is operated to drill the wellbore penetrating the subsurface formation 120. The drill string 140 may include, for example, a Kelly, drill pipe, a bottom hole assembly, and other components. The bottom hole assembly on the drill string may include drill collars, drill bits, the logging tool 102, and other components.

The subsurface formation 120 can include all or part of one or more subsurface zones. The example subsurface formation 120 shown in FIG. 1 includes multiple subsurface zones 122 and the wellbore 104 penetrated through the subsurface zones 122. The subsurface zones 122 can include sedimentary layers, rock layers, sand layers, or combinations of these and other types of subsurface layers. One or more of the subsurface layers can contain fluids, such as brine, oil, gas, etc. Although the example wellbore 104 shown in FIG. 1 is a vertical wellbore, the logging tool 102 can be implemented in other wellbore orientations. For example, the logging tool 102 may be adapted for horizontal wellbores, slanted wellbores, curved wellbores, vertical wellbores, or combinations of these.

In some implementations, the logging tool 102 may perform NMR logging (as further described herein). As shown, for example, in FIG. 1, the logging tool 102 can be deployed in the wellbore 104 on jointed drill pipe, hard wired drill pipe, or other deployment hardware. In some example implementations, the logging tool 102 collects data during drilling operations as it moves downward through the region of interest. In some example implementations, the logging tool 102 collects data while the drill string 140 is moving, for example, while it is being tripped in or tripped out of the wellbore 104.

In some implementations, the logging tool 102 collects data at discrete logging points in the wellbore 104. For example, the logging tool 102 can move upward or downward incrementally to each logging point at a series of depths in the wellbore 104. At each logging point, instruments in the logging tool 102 can perform measurements on the subsurface formation 120 based on NMR logging. The measurement data (NMR relaxation data) can be communicated to a computer 110 for storage, processing, and analysis. Such data may be gathered and analyzed during or after drilling operations (e.g., during logging while drilling (LWD) operations), or during other types of activities.

The NMR measurement data can be used for formation evaluation of the subsurface formation 120. For example, the computer 110 can receive and analyze the NMR measurement data from the logging tool 102 to detect properties of the various subsurface zones 122. For example, the computer 110 can identify the porosity, fluid partition, or other properties of the subsurface zones 122 based on the NMR measurements acquired by the logging tool 102 in the wellbore 104.

In some implementations, the logging tool 102 obtains NMR signals by polarizing nuclear spins in the subsurface formation 120 and pulsing hydrogen nuclei ("protons") with a radio frequency (RF) magnetic field. Various pulse sequences (i.e., series of radio frequency pulses, delays, and other operations) can be used to obtain NMR signals. Examples of NMR pulse sequences can include a Carr Purcell Meiboom Gill (CPMG) sequence. Each CPMG pulse sequence comprises an excitation pulse having a tip angle and a number of refocusing pulses having a flip angle; whether the pulse sequence contains a single refocusing pulse or one thousand refocusing pulses, for example, is at operator discretion. The excitation pulse has a tip angle (spin rotation angle), and refocusing pulses have the flip angle (spin rotation angle). Examples of NMR pulse sequences may also include an Optimized Refocusing Pulse Sequence (ORPS) in which the refocusing pulses have a flip angle less than 180°, a saturation recovery pulse sequence, and other pulse sequences.

A plurality of acquired spin-echo signals (or other NMR data) may be processed (e.g., inverted, transformed, etc.) to generate a relaxation-time distribution. For example, generated relaxation-time distributions can include at least one of a distribution of transverse relaxation times, $T_2$ and a distribution of longitudinal relaxation times, $T_1$. The relaxation-time distribution can be used to determine various physical properties of the formation. In some cases, relaxation-time distributions are acquired for multiple logging points and used to train a model of the subsurface formation. In some cases, relaxation-time distributions are acquired for multiple logging points and used to predict properties of the subsurface formation.

In some instances, all or part of the computer 110 can be implemented as a component of, or can be integrated with one or more components of the logging tool 102. In some cases, the computer 110 can be implemented as one or more computing structures separate from the logging tool 102.

In some implementations, the computer 110 is embedded in the logging tool 102, and the computer 110 and the logging tool 102 can operate concurrently while disposed in the wellbore 104. For example, although the computer 110 is shown above the surface 106 in the example shown in FIG. 1, all or part of the computer 110 may reside below the surface 106, for example, at or near the location of the logging tool 102.

The drilling system 100 can include communication or telemetry equipment that allows communication among the computer 110, the logging tool 102, and other components of the drill string 140. For example, the components of the drill string 140 can each include one or more transceivers or similar apparatus for wired or wireless data communication among the various components. For example, the logging tool 102 and drill string 140 can include systems and apparatus for optical telemetry, wireline telemetry, wired pipe telemetry, mud pulse telemetry, acoustic telemetry, electromagnetic telemetry, or a combination of these and other types of telemetry. In some cases, the logging tool 102 receives commands, status signals, or other types of information from the computer 110 or another source. In some cases, the computer 110 receives logging data, status signals, or other types of information from the logging tool 102 or another source.

NMR logging operations can be performed in connection with various types of downhole operations at various stages in the lifetime of a well system. Structural attributes and components of a surface equipment 112 and the logging tool 102 can be adapted for various types of NMR logging operations. For example, NMR logging may be performed during drilling operations, during wireline logging operations, or in other contexts. As such, the surface equipment 112 and the logging tool 102 may include, or may operate in connection with drilling equipment, wireline logging equipment, or other equipment for other types of operations.

Example NMR Logging Tool

Figure 2:
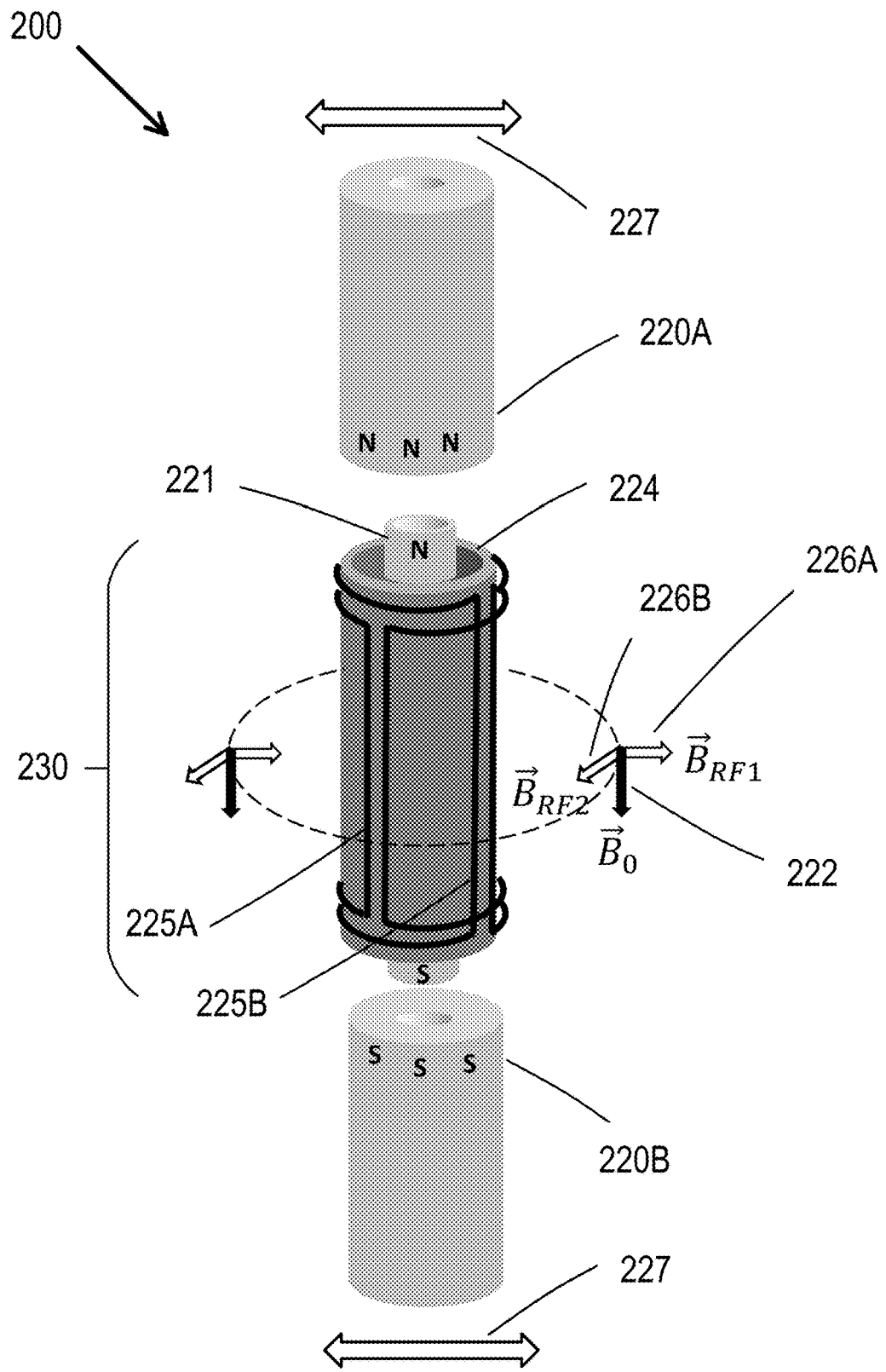
FIG. 2 depicts an example NMR logging tool sensor, according to some embodiments.

An example nuclear magnetic resonance (NMR) logging tool sensor is now described. FIG. 2 depicts an example NMR logging tool, according to some embodiments. An NMR logging tool sensor 200 includes a magnet assembly that includes two end magnets 220A and 220B and a central magnet 221 with its like poles facing the poles of the neighboring end magnets. The central magnet 221 can be used to shape and strengthen a static magnetic field in a region of investigation/sensitivity volume in the subsurface. The static magnetic field produced by the magnet assembly at a sensitive volume in which the NMR logging tool sensor 200 can project a magnetic field 222, depicted by $\vec{B}_0$. The static magnetic field can define a sensitivity volume, which in some embodiments comprises a shape of a cylindric shell.

In some embodiments, the end magnets 220A, 220B can be spaced apart from an axial end of each side of the central magnet 221. The end magnets 220A, 220B together with the central magnet 221 may define four magnetic poles, which may be arranged to enhance the static magnetic field in the region of investigation.

Further depicted in FIG. 2 is an antenna assembly 230, which comprises a soft magnetic core 224 and two orthogonal windings 225A and 225B. The antenna assembly 230 can generate two orthogonal radio frequency (RF) magnetic fields: $\vec{B}_{RF1}$ (226A, produced by the windings 225A) and $\vec{B}_{RF2}$ (226B, produced by the windings 225B). The two RF magnetic fields 226A, 226B can have a phase shift of 90°. Therefore, a circular polarized RF magnetic field can be generated to excite nuclei within the subsurface formation in a more efficient way. The same two windings can be used to receive NMR signals. The NMR signals induced in the orthogonal windings 225A and 225B can then be processed in order to increase a signal-to-noise ratio (SNR) of the acquired NMR data. For example, with reference to FIG. 1, the computer 110 can perform this operation. A direction of lateral displacement as a result of lateral motion (e.g., vibration) is shown at 227.

In some implementations, the NMR logging tool sensor 200 includes a magnet assembly and a transversal-dipole and monopole antenna assembly. The transversal-dipole and monopole antenna assembly can obtain a unidirectional, azimuthally selective NMR response from the region of investigation about the magnet assembly.

Figure 3:
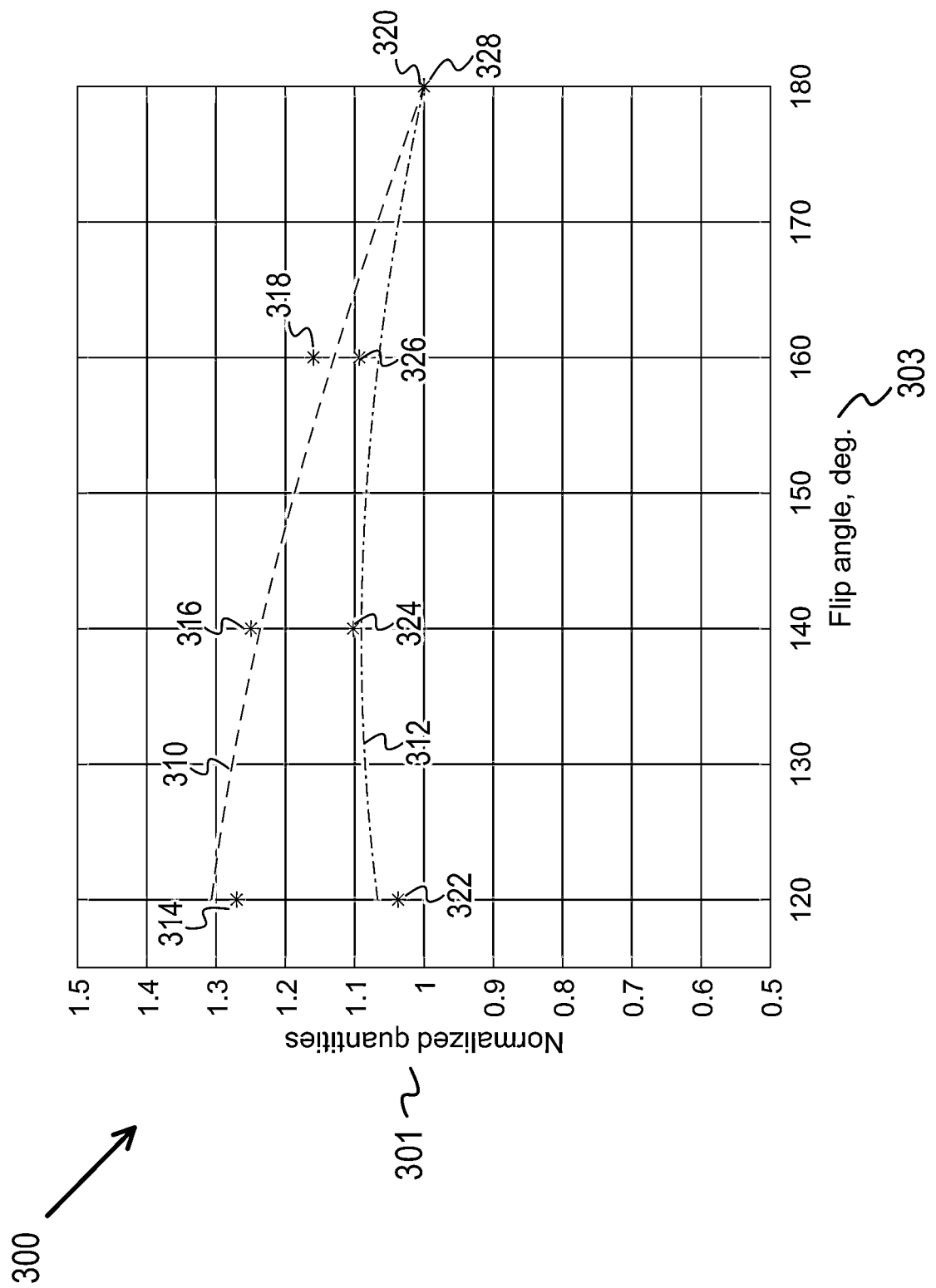
FIG. 3 depicts an example plot of flip angle dependence of the NMR signal and the SNR for an NMR operation that does not take into account lateral motion in flip angle selection.

For NMR logging operations, the selected flip angle of refocusing pulses can affect resulting NMR relaxation data. For example, the selected flip angle can impact an NMR signal level and a signal-to-noise ratio (SNR). To illustrate, FIG. 3 depicts an example plot of flip angle dependence of the NMR signal and the SNR for an NMR operation that does not take into account lateral motion in flip angle selection. Shown in FIG. 3 are normalized experimental and numerically simulated data points. A plot 300 includes an x-axis 303 that is a flip angle of a refocusing pulse in degrees. The plot 300 includes a y-axis 301 that comprises normalized quantities of NMR signal (spin-echo signal) and SNR data. The curves of the plot 300 are results of a numerical simulation (310 for an NMR signal and 312 for the SNR). A series of experimental data points (314-320 for NMR Signal, 322-328 for SNR) depict the experimental results in a gradient static magnetic field as a function of the flip angle. The plot 300 shows that a maximum signal-to-noise ratio corresponds to a flip angle of a refocusing pulse of approximately 135°-140°.

Figure 4:
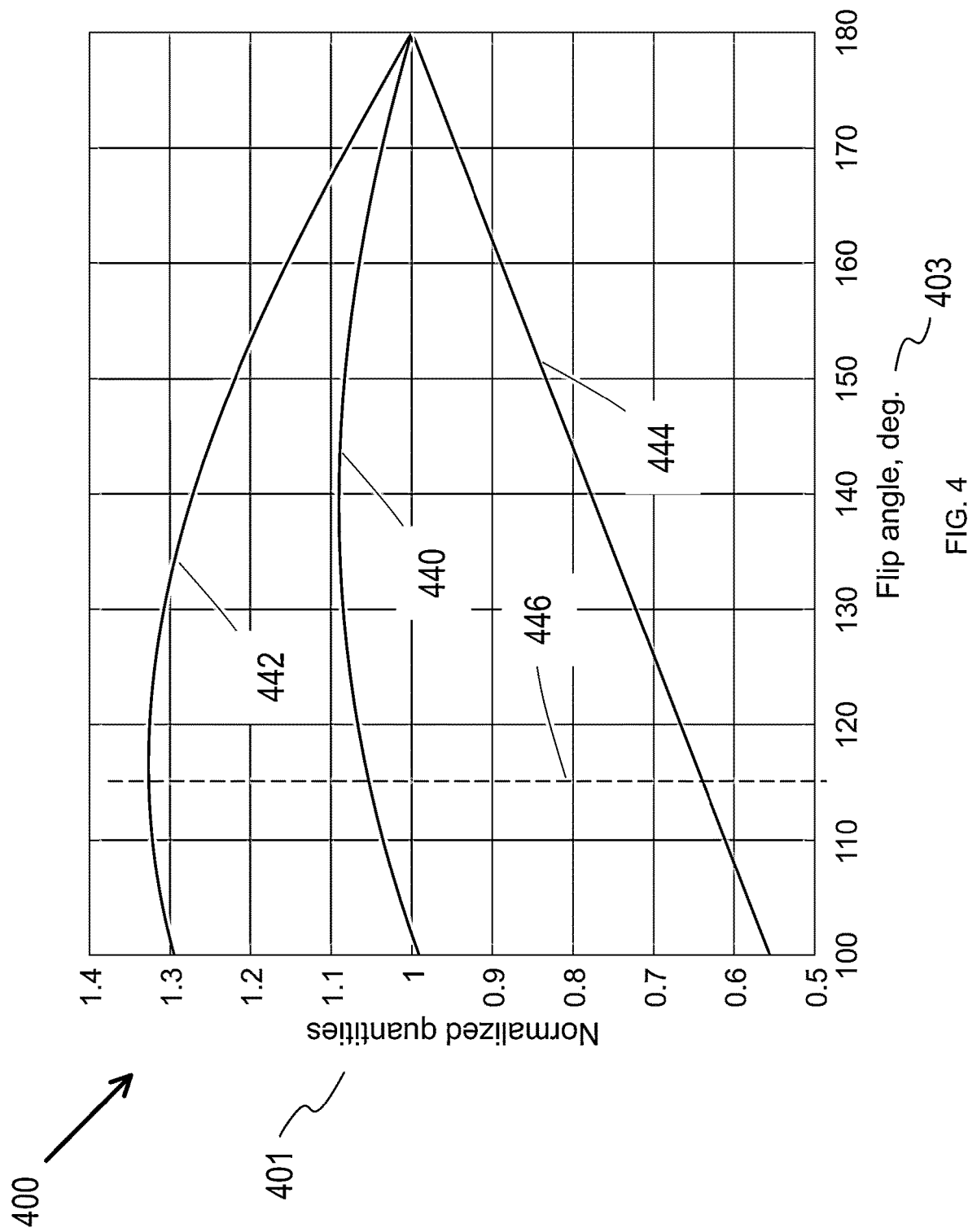
FIG. 4 depicts an example plot of flip angle effect on system parameters, pertaining specifically to motion error and its effect on a signal-to-noise ratio (SNR), according to some embodiments.

When a lateral displacement and lateral motion error are factored into flip angle selection, the resulting flip angle of the refocusing pulse(s) can be, on average, lower than flip angles that do not account for lateral motion. For example, FIG. 4 depicts an example plot of flip angle effect on system parameters related to motion error and its effect on a signal-to-noise ratio (SNR), according to some embodiments. FIG. 4 depicts a plot 400 comprising an x-axis 403 which is the flip angle in degrees. The plot 400 includes a y-axis 401 which comprises normalized quantities of SNR data and a normalized motion error. The plot 400 further includes three trends which model SNR and motion attributes. A curve 442 is a SNR with motion noise factored in. A curve 440 is a SNR absent motion noise. A trend line 444 is a motion error trend with respect to a selected flip angle. As shown, the SNR with motion noise represented by curve 442 reaches a maximum (i.e., the SNR is optimized) at a lower flip angle than the curve 440 comprising the SNR without motion noise. The SNR absent motion noise represented by the curve 440 peaks at a flip angle of approximately 140° similar to the SNR of FIG. 3, whereas the SNR including motion noise, represented by the curve 442, reaches a maximum at a lower flip angle of approximately 115°. This is represented by a maximum SNR trend line 446. Thus, when lateral motion noise is considered in flip angle selection, the resulting flip angle will likely be lower than if lateral motion noise was not taken into account. An additional benefit to the lower flip angle is that power consumption required by the NMR logging tool can also lower (due to implementation of shorter pulses of an identical amplitude having lower energy).

Figure 5:
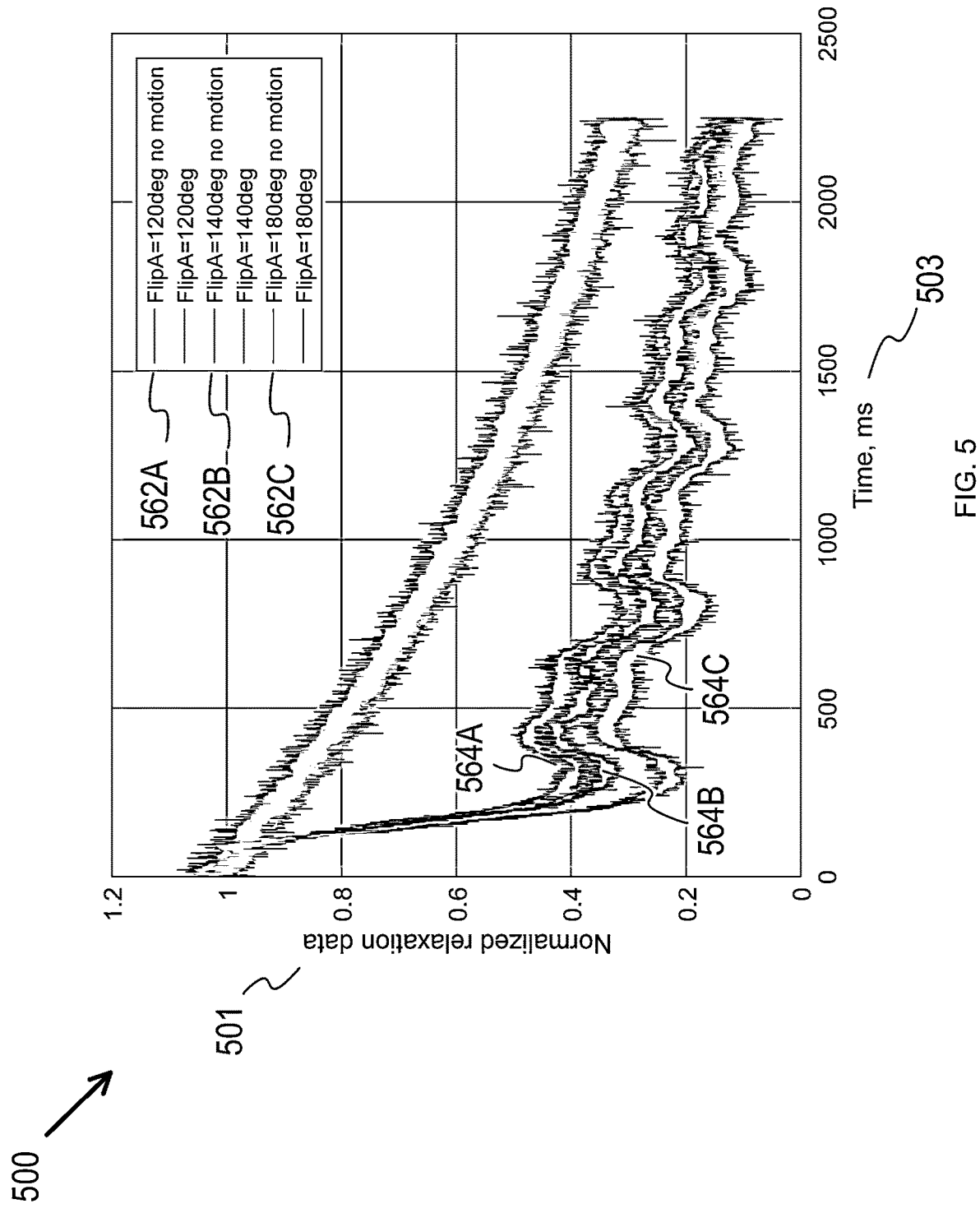
FIG. 5 depicts an example plot of motion effects on collected relaxation data in response to pulse sequences of various flip angles, according to some embodiments.

Transversal NMR relaxation data is acquired by the NMR sensor after each refocusing pulse of the pulse sequence in the form of NMR spin-echo signals. The SNR of the NMR relaxation data can be dependent on the extent of lateral motion exhibited on the NMR sensor and the selected flip angle used to counteract the motional effects. To help illustrate the extent to which lateral motion affects NMR relaxation measurements, FIG. 5 depicts an example plot of logging tool motion effects on collected relaxation data in response to refocusing pulses of various flip angles, according to some embodiments. A plot 500 depicts transversal ($T_2$) NMR relaxation measurements of an experiment in which an NMR sensor (similar to the example NMR sensor of FIG. 2) underwent various test cycles with differing flip angles and motion exhibition while acquiring the NMR transversal relaxation data. The plot 500 includes an x-axis 503 which is time in milliseconds, although the time can be expressed in other units. The plot 500 further includes a y-axis 501 having normalized quantities of the NMR relaxation data. To increase the SNR of the data, the motion was synchronized with a CPMG pulse train and multiple repetitions were used for data stacking.

Curves 562A-C represent NMR relaxation measurements wherein the NMR sensor was subject to no lateral motion. Selected flip angles vary between the three curves, yet curves 562A-C overlap consistently through time. Curves 564A-C were subject to lateral motion, and the NMR relaxation measurements show the effect lateral motion exhibits upon NMR relaxation data. The accuracy of the NMR relaxation data of curves 564A-C is reduced because of the lateral motion. However, a discrepancy between the curves 564A-C is caused by each respective flip angle used for each test cycle. For example, the curve 564C utilizes a flip angle of 180° and comprises the most heavily effected NMR data from lateral motion effect. The curve 564A is an example having the least effect of lateral motion error of curves 564A-C with a flip angle of 120°. Thus, when subject to lateral motion, a lower selected flip angle of the refocusing pulses within the pulse sequence should reduce the effects of lateral motion error and improve the signal-to-noise ratio (SNR) of the resulting NMR relaxation dataset.

Figure 6:
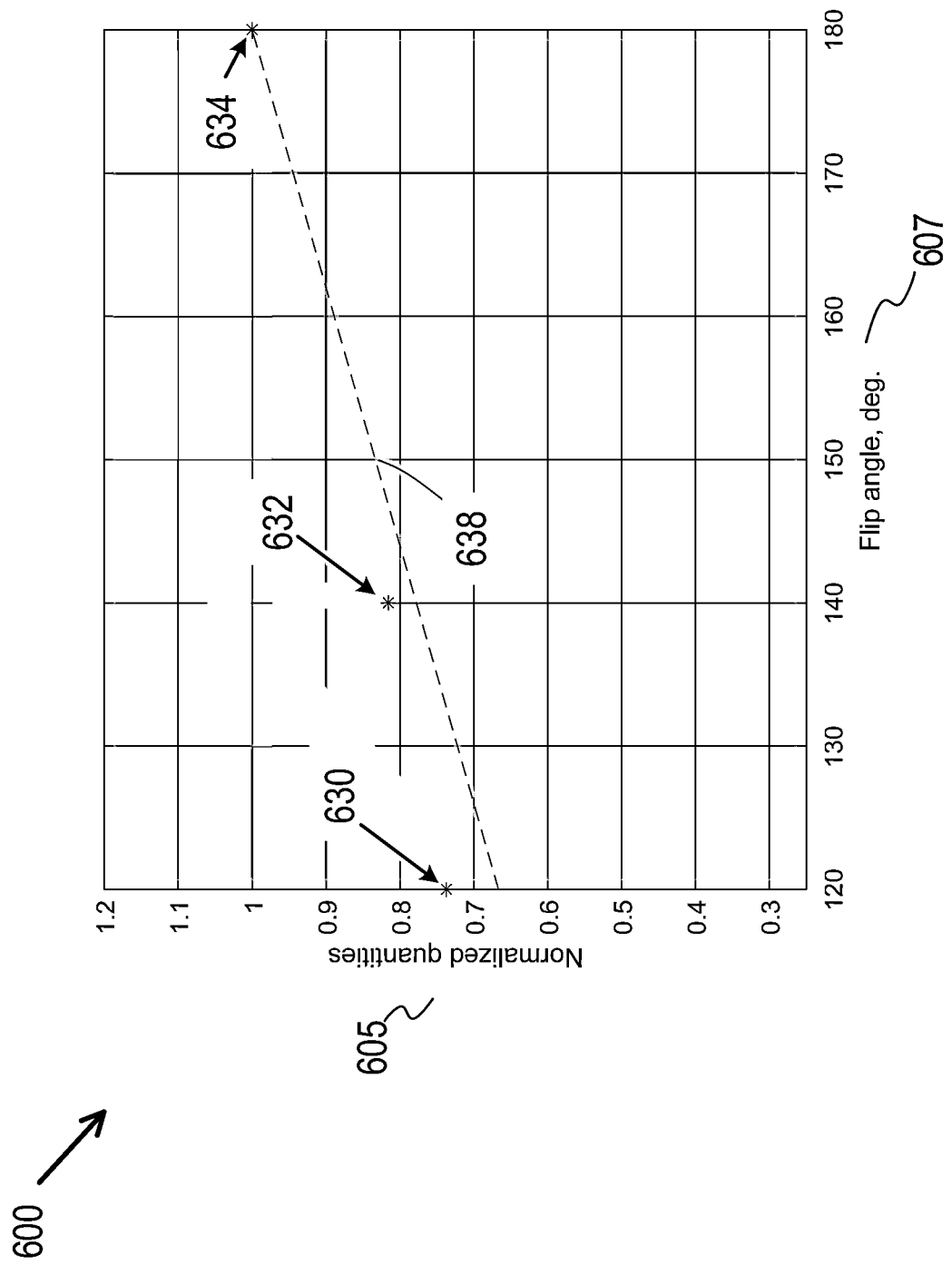
FIG. 6 depicts an example plot of an experimental and a simulated motion error, according to some embodiments.

To help illustrate the lateral motion error of the lateral motion of FIG. 5, FIG. 6 depicts an example plot of an experimental and a simulated motion error, according to some embodiments. FIG. 6 comprises a plot 600 having an x-axis 607 which is a flip angle in degrees (as the flip angle is proportional to a refocusing pulse width), and a y-axis 605 having normalized quantities of the motion error. Presented in FIG. 6 are three experimental points 630, 632, and 634. The experimental points 630, 632, and 634 correspond to the flip angles of 120°, 140°, and 180°, as represented in FIG. 5. The experimental points 630, 632, and 634 depict a maximum distortion of the relaxation curves 564A-C of FIG. 5 relative to each respective curve without motion for different flip angles (i.e., curve 564A in relation to curve 562A, curve 564B in relation to curve 562B, etc.). Also shown is a dashed line 638 representing a simplified, simulated analytical model for modeling the lateral motion error—as the flip angle decreases, so does the error. This is evident by the NMR relaxation curves of FIG. 5 for which FIG. 6 summarizes the error of. For the example presented across FIG. 5 and FIG. 6, the experimental data obtained which describes the lateral motion of the NMR sensor is represented by Equation (1) below:

$$d(t) = A \cdot [1 - \cos(4\pi \cdot t)] \quad (1)$$

wherein d(t) is the lateral displacement of the NMR logging tool and thereby the NMR sensor as a function of time, A is an amplitude (maximum) of the displacement, and t is a time.

Example Operations

Figure 7:
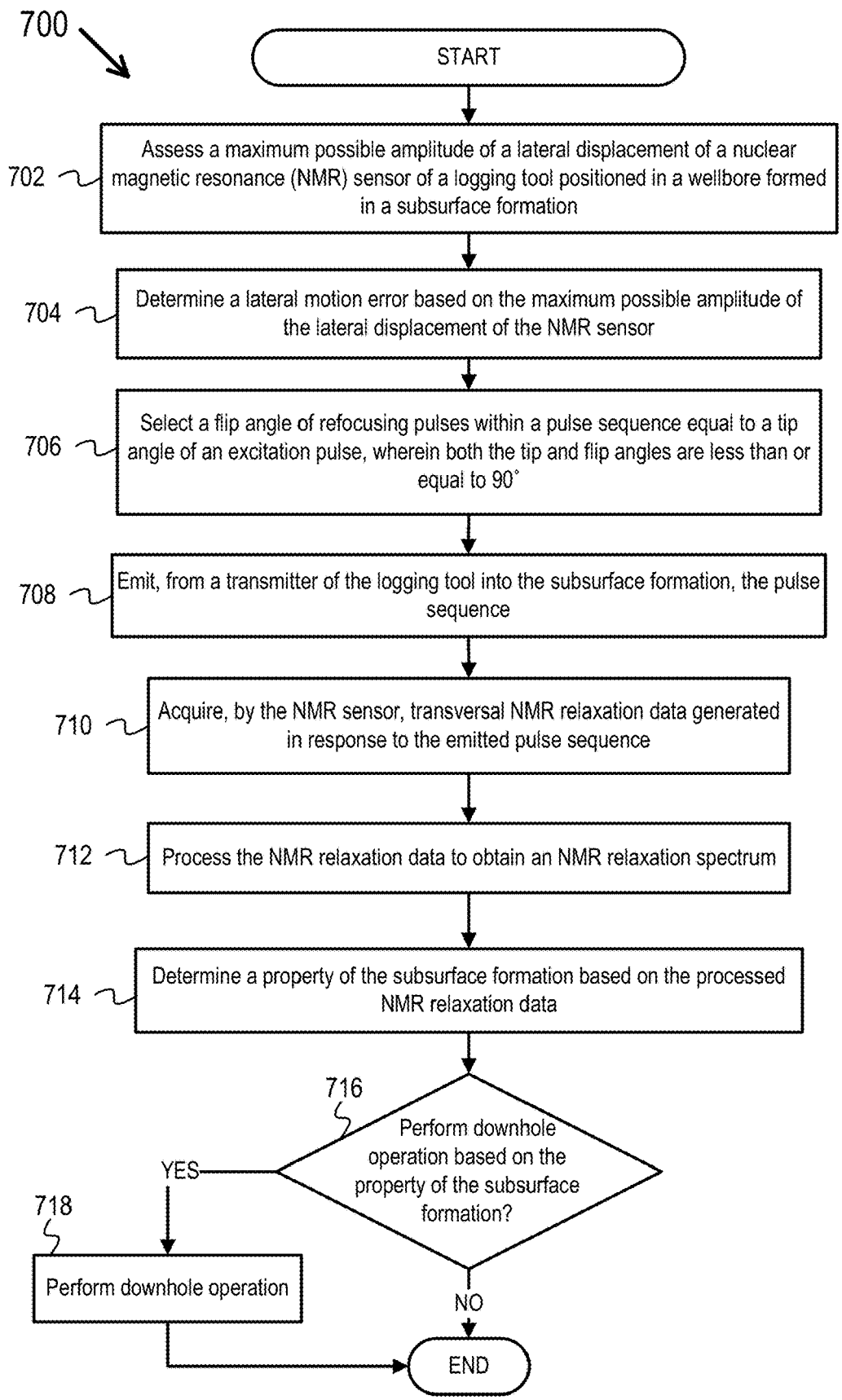
FIG. 7 depicts a flowchart of a first example of operations for reducing error in NMR logging caused by tool motion, according to some embodiments.

Example operations are now described. FIG. 7 depicts a flowchart of a first example of operations for reducing error in NMR logging caused by tool motion, according to some embodiments. Operations of a flowchart 700 can be performed by software, firmware, hardware, or a combination thereof. Such operations are described with reference to the systems of FIGS. 1-6. However, such operations can be performed by other systems or components. For example, at least some of the operations of the flowchart 700 are described as being performed by a computer at a surface of the wellbore. In some embodiments, one or more of these operations can be performed by a computer at the surface and/or downhole in the wellbore. The operations of the flowchart 700 start at block 702.

At block 702, a maximum possible amplitude of a lateral displacement of a nuclear magnetic resonance (NMR) sensor of a logging tool (positioned in a wellbore formed in a subsurface formation) is assessed. For example, with reference to FIG. 1, the computer 110 can make this assessment. Various sources of noise are inherent to NMR logging operations, especially logging-while drilling (LWD) applications. During LWD operations, NMR sensors and the logging tools in which they can be disposed within are subject to an additional source of noise as a drill bit of a drill string drills a wellbore through a subsurface formation. For example, such drilling can introduce lateral motion noise or vibration. With reference to FIG. 1, drilling using the drill string 140 may cause vibration of the logging tool 102. For example, with reference to FIG. 2, the NMR logging tool sensor 200 may be subject to a lateral motion 227 as the tool attempts to collect measurements of the subsurface formation.

To reduce error in obtained measurements, the maximum possible amplitude of the lateral displacement of the NMR sensor ("maximum lateral displacement") can be determined by a stabilizer gauge on the logging tool. The stabilizer may comprise one or multiple sections of pipe which function as a tool to stabilize the drill string downhole. The stabilizer sections are wider than pipe used for the drill string. The wider "gauge" of the stabilizer can be a known value that, in relation to the wellbore diameter, determines the maximum lateral displacement of the NMR sensor of the logging tool. Typically, the maximum lateral displacement in relation to the stabilizer gauge can correspond to a diameter that is a $\frac{1}{8}^{th}$ to $\frac{1}{4}^{th}$ inch smaller than the wellbore diameter. In some cases, the maximum amplitude of the lateral displacement can be assessed using NMR relaxation data acquired with different acquisition windows or using a motion sensitive device, e.g., an accelerometer or acoustic caliper.

At block 704, a lateral motion error is determined based on the maximum possible amplitude of the lateral displacement of the NMR sensor. For example, with reference to FIG. 1, the computer 110 can determine the lateral motion error. For a multi-train downhole experiment, the motion error can be considered as a slowly changing random quantity reflecting the magnitude of random lateral displacement with the maximum displacement related to the gauge of the stabilizer. The random lateral displacement of the sensor in the wellbore during a CPMG train can determine motion noise. Quantifying the lateral motion error based on the maximum lateral displacement of the NMR sensor can allow system parameters to account for the error before conducting operations.

Further, the maximum lateral displacement of the NMR sensor in block 702 can be used to determine properties of the lateral motion error due to variation of the sensitivity volume. Equations (2) and (3) represent the standard deviation (STD) and the mean value (MEAN) of the motion noise (both parameters are relative to the total signal), respectively:

$$\delta_{motion\_std} = \frac{1}{\pi} \cdot \frac{d_{max}}{\sqrt{3}} \cdot \frac{1}{k_{SV}} \cdot \frac{\beta}{\pi} \quad (2)$$

$$\delta_{motion\_mean} = \frac{1}{\pi} \cdot d_{max} \cdot \frac{1}{k_{SV}} \cdot \frac{\beta}{\pi} \quad (3)$$

where $d_{max}$ is the maximum possible lateral displacement of the sensor (determined by the gauge of the stabilizer), $\beta$ is a flip angle of a refocusing pulse (proportional to the width of the refocusing pulse), and $k_{SV}$ is an effective thickness of the sensitivity volume (with no lateral motion) corresponding to a 180° ($\pi$) flip angle. The values of the mean lateral motion error (modeled by Equation (3)) and standard deviation (modeled by Equation (2)) can be estimated using an effective system bandwidth (at $\beta=\pi$), and a static magnetic field gradient as presented in Equation (4), $$k_{SV} = \frac{\Delta\omega_{eff\_\pi}}{\gamma G} \quad (4)$$

where $\Delta\omega_{eff\_\pi}$ is the effective system bandwidth at the "standard" flip angle of 180°, G is the static magnetic field gradient, and $\gamma$ is the gyro-magnetic ratio for hydrogen nuclei. For example, in a case where $k_{SV}=\frac{1}{2}$ inches and $d_{max}=\frac{1}{8}$ inches, the estimated parameters of the motion error for $\beta=\pi$ are as follows: $\delta_{motion\_std}=4.6\%$ and $\delta_{motion\_mean}=8\%$, respectively.

At block 706, a flip angle of refocusing pulse(s) within a CPMG pulse sequence is selected to be equal to a tip angle of an excitation pulse, wherein both the tip and flip angles are equal or less than 90°. For example, with FIG. 1, the computer 110 can make this selection.

At block 708, the pulse sequence having the excitation pulse with the tip angle and the number of refocusing pulse(s) with the flip angle that are substantially equal to or smaller than 90° is emitted from a transmitter of the logging tool into the subsurface formation. For example, with reference to FIG. 2, the windings 225A and 225B of the antenna assembly 230 can emit the pulse sequence.

At block 710, transversal NMR relaxation data generated in response to the emitted pulse sequence having the selected flip angle is acquired by the NMR sensor. For example, with reference to FIG. 2, the windings 225A and 225B can acquire the transversal NMR relaxation data. For example, with reference to FIG. 5, the NMR relaxation data acquired by the sensor appears similar to curves 564A-C when influenced by lateral motion. The selected flip angle of the CPMG pulse sequence should improve the signal-to-noise ratio (SNR) of the acquired NMR relaxation data than would a refocusing pulse sequence comprising a flip angle selected without consideration of lateral motion noise. For example, this is depicted in FIGS. 3-4 as described above, wherein the SNR is maximized at a lower flip angle when lateral motion noise is accounted for (e.g., the 115° flip angle vs. 140° flip angle).

The transversal NMR relaxation data is acquired by the NMR sensor after each refocusing pulse of the pulse sequence in the form of NMR spin-echo signals. The SNR of the NMR relaxation data is dependent on the extent of lateral motion exhibited on the NMR sensor and the selected flip angle used to counteract the motional effects. For example, with reference to FIG. 5, the plot 500 depicts various test cycles with differing flip angles and motion exhibition while acquiring NMR transversal relaxation data. To increase the SNR of the data, the motion was synchronized with a CPMG pulse train and multiple repetition was used for data stacking. The lateral motion in which the NMR sensor was subjected to is modeled by Equation (1) (set forth above).

As described previously in FIG. 6, the experimental points 630, 632, and 634 correspond to the flip angles of 120°, 140°, and 180°, as represented in FIG. 5. The dashed line 638 represents a simplified, simulated analytical model for modeling the lateral motion. The experimental points 630, 632, and 634 and the simplified simulated model of motional error, represented by the dashed line 638, predict the following expression for the relative motion error, Equation (5), as a function of the refocusing pulse flip angle:

$$\frac{\delta_{motion\_max}}{\delta_{motion\_max}(\beta = \pi)} = \frac{\beta}{\pi} \quad (5)$$

wherein $\delta_{emotion\_max}$ is the maximum lateral motion error, and $\delta_{emotion\_max}(\beta=\pi)$ is the maximum lateral motion error when the flip angle is equal to $\pi$ (180°).

At block 712, the NMR relaxation data is processed to obtain an NMR relaxation spectrum. For example, with reference to FIG. 1, the computer 110 can process the NMR relaxation data to obtain the NMR relaxation spectrum.

At block 714, a property of the subsurface formation is determined based on the processed NMR relaxation data. For example, with reference to FIG. 1, the computer 110 can determine the property of the subsurface formation. The property of the subsurface formation may include a porosity, permeability, formation content, and a fluid composition, among other properties.

At block 716, a determination is made of whether to perform a downhole operation based on the property of the subsurface formation. For example, with reference to FIG. 1, the computer 110 can make this determination. Based on the property of the subsurface formation, a downhole operation can be performed, changed, stopped, etc. For example, in a drilling operation, one or more subsurface zones may be selected as the zone in which to drill a lateral well based on the subsurface formation property. Accordingly, a drilling direction can be changed during a geosteering operation based on the determined subsurface formation property. If a downhole operation is to be performed, operations of the flowchart 700 continue at block 718. Otherwise, operations of the flowchart 700 are complete.

At block 718, the downhole operation is performed. For example, with reference to FIG. 1, the surface equipment 112, the drill string 140, or the logging tool 102 may perform the downhole operation, depending on the type of operation to be completed.

Figure 8:
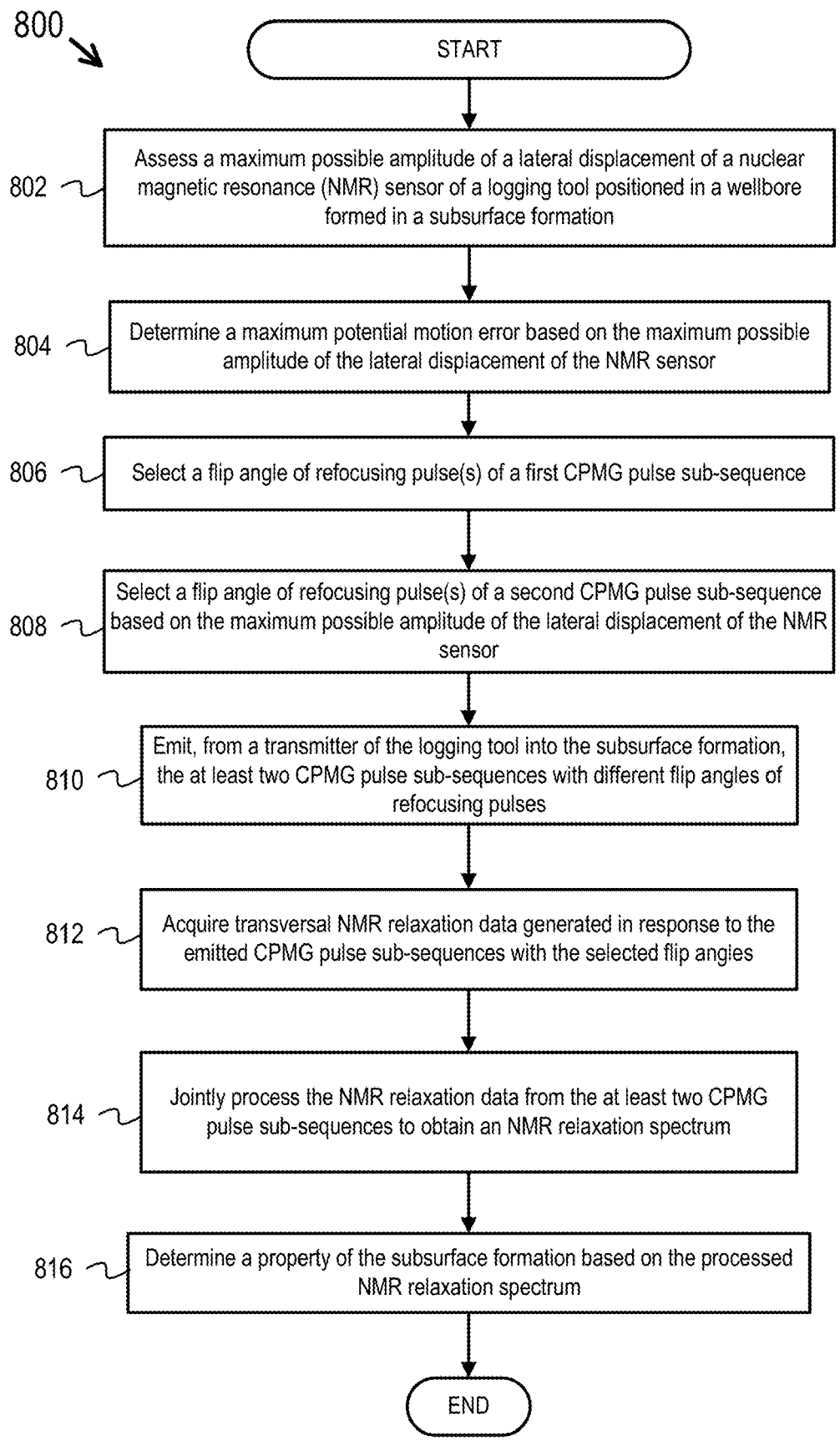
FIG. 8 depicts a flowchart of a second example of operations for reducing error in NMR logging caused by tool motion, according to some embodiments.

FIG. 8 depicts a flowchart of a second example of operations for reducing error in NMR logging caused by tool motion, according to some embodiments. Operations of a flowchart 800 can be performed by software, firmware, hardware, or a combination thereof. Such operations are described with reference to the systems of FIGS. 1-6. However, such operations can be performed by other systems or components. For example, at least some of the operations of the flowchart 800 are described as being performed by a computer at a surface of the wellbore. In some embodiments, one or more of these operations can be performed by a computer at the surface and/or downhole in the wellbore. The operations of the flowchart 800 start at block 802.

At block 802, a maximum possible amplitude of a lateral displacement of a nuclear magnetic resonance (NMR) sensor of a logging tool positioned in a wellbore formed in a subsurface formation is determined. For example, with reference to FIG. 1, the computer 110 can make this determination. In some embodiments, this operation can be similar to the determination operation at block 702 of the flowchart 700 of FIG. 7 (described above).

At block 804, a lateral motion error is determined based on the maximum possible amplitude of the lateral displacement of the NMR sensor. For example, with reference to FIG. 1, the computer 110 can make this determination of lateral motion error. In some embodiments, this operation can be similar to the determination operation at block 704 of the flowchart 700 of FIG. 7 (described above).

At block 806, a flip angle of refocusing pulse(s) of a first CPMG pulse sub-sequence is selected. For example, with FIG. 1, the computer 110 can make this selection. In this instance, the flip angle is selected to be between a tip angle of the pulse sub-sequence and 180°. The "sub-sequence" refers to a component pulse sequence of an overall CPMG sequence, where each sub-sequence comprises an excitation pulse having a tip angle and a number of refocusing pulses having a flip angle. Each sub-sequence of the overall CPMG pulse sequence can be used to optimize a specific parameter in received data.

At block 808, a flip angle of a second CPMG pulse sub-sequence is selected based on the maximum possible amplitude of the lateral displacement of the NMR sensor, wherein the flip angle of the second sub-sequence is different from the flip angle of the first sub-sequence. For example, with reference to FIG. 1, the computer 110 can make this selection of the flip angle. In some embodiments, the second flip angle is chosen to be different, and lower, than the flip angle of the first CPMG sub-sequence to reduce motional effects on slower relaxation components of a transversal relaxation spectrum of NMR relaxation data. Lateral motion largely affects the slower components of a transversal relaxation spectrum. As previously stated, each sub-sequence of the overall CPMG pulse sequence can be used to optimize a specific parameter in acquired NMR relaxation data. While the larger flip angle of the first CPMG sub-sequence may optimize the SNR, the lower flip angle of the second CPMG sub-sequence may be of an angle regime with minimal motion error and smaller (yet sufficient to acquire longer relaxation components) SNR to reduce motional error effects on longer relaxation components that otherwise would be strongly affected by lateral motion of the NMR sensor. The flip angle of the first sub-sequence can be better optimized to the maximum SNR regime to acquire shorter relaxation components that are typically not as affected by the lateral motion. The CPMG pulse sequence may comprise more than two sub-sequences, although a minimum of two sub-sequences is required. The flip angle of at least one sub-sequence will have a lower flip angle than the other(s).

At block 810, the at least two CPMG pulse sub-sequences with different flip angles of refocusing pulses are emitted from a transmitter of the logging tool into the subsurface formation. For example, with reference to FIG. 2, the windings 225A and 225B of the antenna assembly 230 can emit the CPMG pulse sub-sequences. Each pulse sub-sequence comprises an excitation pulse emitted at a tip angle and a plurality of refocusing pulses. At least one of the pulse sub-sequences comprises the smaller flip angle, and at least one pulse sub-sequence comprises the larger flip angle. The pulse sub-sequences may be emitted in series or concurrently depending on a configuration of the sensor unit of the logging tool.

At block 812, transversal NMR relaxation data generated in response to the emitted CPMG pulse sub-sequences with the selected flip angles is acquired. For example, with reference to FIG. 2, the windings 225A and 225B can acquire the NMR relaxation data. In some embodiments, this operation can be similar to the data acquisition operation at block 710 of the flowchart 700 of FIG. 7 (described above).

At block 814, the NMR relaxation data from the at least two CPMG pulse sub-sequences is jointly processed to obtain an NMR relaxation spectrum. For example, with reference to FIG. 1, the computer 110 can process the NMR relaxation data. Each refocusing pulse in each of the CPMG pulse sub-sequences generates an NMR spin-echo signal in response. Thus, each sub-sequence will have its own NMR relaxation dataset. However, a sub-sequence may compromise on the quality of a data parameter. For example, the CPMG sub-sequence with the lower flip angle reduces lateral motion effects on longer NMR relaxation components at the expense of lowering the SNR. Rather than relying on a single sub-sequence to characterize the acquired NMR data or utilizing a single CPMG pulse sequence that neither optimizes SNR nor lateral motion error reduction, the NMR relaxation datasets of each CPMG sub-sequence can be jointly processed and inverted. The resultant NMR spectrum accounts for lateral motion error in longer relaxation components and retains a favorable signal-to-noise ratio through usage of the CPMG sub-sequences with differing flip angles. The joint processing of the NMR data also increases accuracy and precision of measurements of parameters used in characterizing properties of the subsurface formation.

At block 816, a property of the subsurface formation is determined based on the processed NMR relaxation spectrum. For example, with reference to FIG. 1, the computer 110 can determine the property of the subsurface formation. This determination can be similar to the determination operation at block 714 of flowchart 700 of FIG. 7 (described above).

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. It will be understood that each block of the flowchart illustrations and/or block diagrams, and combinations of blocks in the flowchart illustrations and/or block diagrams, can be implemented by program code. The program code may be provided to a processor of a computer or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine-readable medium(s) may be utilized. The machine-readable medium may be a machine-readable signal medium or a machine-readable storage medium. A machine-readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine-readable storage medium would include the following: a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain or store a program for use by or in connection with an instruction execution system, apparatus, or device. A machine-readable storage medium is not a machine-readable signal medium.

A machine-readable signal medium may include a propagated data signal with machine-readable program code embodied therein, for example, in baseband or as part of a carrier wave. Such a propagated signal may take any of a variety of forms, including, but not limited to, electromagnetic, optical, or any suitable combination thereof. A machine-readable signal medium may be any machine-readable medium that is not a machine-readable storage medium and that can communicate, propagate, or transport a program for use by or in connection with an instruction execution system, apparatus, or device.

Program code embodied on a machine-readable medium may be transmitted using any appropriate medium, including but not limited to wireless, optical fiber cable, RF, etc., or any suitable combination of the foregoing.

The program code/instructions may also be stored in a machine-readable medium that can direct a machine to function in a particular manner, such that the instructions stored in the machine-readable medium produce an article of manufacture including instructions which implement the function/act specified in the flowchart and/or block diagram block or blocks.

Example Computer

Figure 9:
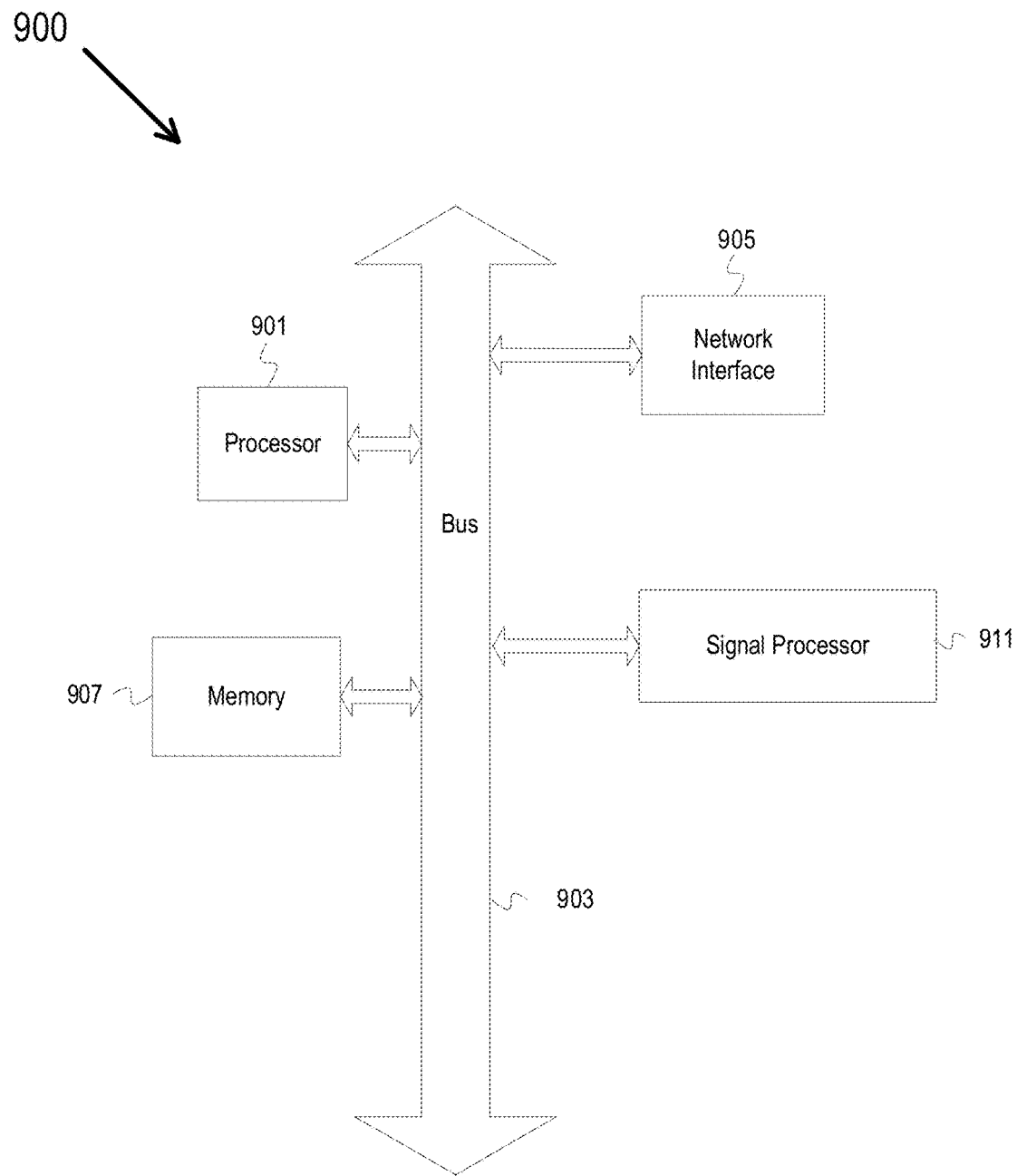
FIG. 9 depicts an example computer, according to some embodiments.

FIG. 9 depicts an example computer, according to some embodiments. A computer 900 includes a processor 901

(possibly including multiple processors, multiple cores, multiple nodes, and/or implementing multi-threading, etc.). The computer 900 includes a memory 907. The memory 907 may be system memory or any one or more of the above already described possible realizations of machine-readable media. The computer 900 also includes a bus 903 and a network interface 905. The computer 900 can communicate via transmissions to and/or from remote devices via the network interface 905 in accordance with a network protocol corresponding to the type of network interface, whether wired or wireless and depending upon the carrying medium. In addition, a communication or transmission can involve other layers of a communication protocol and or communication protocol suites (e.g., transmission control protocol, Internet Protocol, user datagram protocol, virtual private network protocols, etc.).

The computer 900 also includes a signal processor 911 that can perform at least some of the operations described herein. Any one of the previously described functionalities may be partially (or entirely) implemented in hardware and/or on the processor 901. For example, the functionality may be implemented with an application specific integrated circuit, in logic implemented in the processor 901, in a co-processor on a peripheral device or card, etc. Further, realizations may include fewer or additional components not illustrated in FIG. 9 (e.g., video cards, audio cards, additional network interfaces, peripheral devices, etc.). The processor 901 and the network interface 905 are coupled to the bus 903. Although illustrated as being coupled to the bus 903, the memory 907 may be coupled to the processor 901.

While the aspects of the disclosure are described with reference to various implementations and exploitations, it will be understood that these aspects are illustrative and that the scope of the claims is not limited to them. In general, techniques for nuclear magnetic resonance (NMR) logging operations as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Example Embodiments

Embodiment #1: A method comprising: generating at least a first pulse sub-sequence comprising a number of refocusing pulses at a first flip angle; generating at least a second pulse sub-sequence comprising a number of refocusing pulses at a second, lower flip angle; detecting, by a nuclear magnetic resonance (NMR) sensor of a logging tool positioned in a wellbore formed in a subsurface formation, NMR spin-echo signals generated in response to at least the first pulse sub-sequence to acquire a first dataset of transversal NMR relaxation data; detecting, by the NMR sensor, NMR spin-echo signals generated in response to at least the second pulse sub-sequence to acquire a second dataset of transversal NMR relaxation data; and determining a property of the subsurface formation based on the first and second datasets of transversal NMR relaxation data.

Embodiment #2: The method of Embodiment 1, wherein the determining the property of the subsurface formation comprises jointly processing and inverting at least the first dataset of transversal NMR relaxation data and at least the second dataset of transversal NMR relaxation data.

Embodiment #3: The method of any one of Embodiments 1-2, wherein the number of refocusing pulses can comprise a single refocusing pulse.

Embodiment #4: The method of any one of Embodiments 1-3, wherein the second, lower flip angle is selected based, at least in part, on a lateral motion parameter of the NMR sensor.

Embodiment #5: The method of Embodiment 4, wherein the second, lower flip angle is used to acquire longer components of a transversal NMR relaxation data spectrum.

Embodiment #6: The method of any one of Embodiments 1-5, wherein generating the at least first pulse sub-sequence further comprises: emitting an excitation pulse at a tip angle into the subsurface formation; and emitting the number of refocusing pulses at the first flip angle into the subsurface formation.

Embodiment #7: The method of any one of Embodiments 1-6, wherein generating the at least second pulse sub-sequence further comprises: emitting an excitation pulse at a tip angle into the subsurface formation; and emitting the number of refocusing pulses at the second, lower flip angle into the subsurface formation.

Embodiment #8: The method of any one of Embodiments 1-7, wherein the at least first pulse sub-sequence is at least one Carr Purcell Meiboom Gill (CPMG) pulse sequence and the at least second pulse sub-sequence is at least one Carr Purcell Meiboom Gill (CPMG) pulse sequence, and wherein the at least first pulse sub-sequence and the at least second pulse sub-sequence are parts of an overall pulse sequence.

Embodiment #9: A system comprising: a downhole tool to be conveyed in a wellbore formed in a subsurface formation, wherein the downhole tool comprises, a transmitter to emit into the subsurface formation at least a first pulse sub-sequence and second pulse sub-sequence; and a nuclear magnetic resonance (NMR) sensor to detect at least a first transversal NMR relaxation dataset and at least a second transversal NMR relaxation dataset generated in response to emission of at least the first and second pulse sub-sequences; a processor; and a machine-readable medium having program code executable by the processor to cause the processor to, generate at least the first pulse sub-sequence comprising a number of refocusing pulses at a first flip angle; generate at least the second pulse sub-sequence comprising a number of refocusing pulses at a second, lower flip angle; detect, by the NMR sensor, NMR spin-echo signals generated in response to at least the first pulse sub-sequence to acquire the first dataset of transversal NMR relaxation data; detect, by the NMR sensor, NMR spin-echo signals generated in response to at least the second pulse sub-sequence to acquire the second dataset of transversal NMR relaxation data; and determine a property of the subsurface formation based on at least the first and second datasets of transversal NMR relaxation data.

Embodiment #10: The system of Embodiment 9, wherein the program code executable by the processor to cause the processor to determine the property of the subsurface formation comprises program code executable by the processor to cause the processor to jointly process and invert at least the first dataset of transversal NMR relaxation data and at least the second dataset of transversal NMR relaxation data.

Embodiment #11: The system of any one of Embodiments 9-10, wherein the program code comprises program code executable by the processor to cause the processor to select the second, lower flip angle based on a lateral motion parameter of the NMR sensor.

Embodiment #12: The system of Embodiment 11, further comprising: a stabilizer coupled to the downhole tool and to laterally move within the wellbore during a downhole operation.

Embodiment #13: The system of Embodiment 12, wherein the lateral motion parameter is a maximum possible amplitude of a lateral displacement of the NMR sensor, wherein the program code comprises program code executable by the processor to cause the processor to determine the maximum possible amplitude of the lateral displacement of the NMR sensor based on a gauge of the stabilizer, and wherein the program code to determine the maximum possible amplitude of the lateral displacement of the NMR sensor based on the gauge of the stabilizer comprises program code executable by the processor to cause the processor to determine a lateral motion error based on the maximum possible amplitude of the lateral displacement of the NMR sensor.

Embodiment #14: The system of Embodiment 13, wherein the program code to determine the lateral motion error comprises program code executable by the processor to cause the processor to select the second, lower flip angle based on the lateral motion error.

Embodiment #15: The system of any one of Embodiments 9-14, wherein the program code to generate at least the first pulse sub-sequence further comprises program code executable by the processor to cause the processor to: emit an excitation pulse at a tip angle into the subsurface formation; and emit the number of refocusing pulses at the first flip angle into the subsurface formation.

Embodiment #16: The system of any one of Embodiments 9-15, wherein the program code to generate at least the second pulse sub-sequence further comprises program code executable by the processor to cause the processor to: emit an excitation pulse at a tip angle into the subsurface formation; and emit the number of refocusing pulses at the second, lower flip angle into the subsurface formation.

Embodiment #17: One or more non-transitory machine-readable media comprising program code executable by a processor to cause the processor to: generate at least a first pulse sub-sequence comprising a number of refocusing pulses at a first flip angle; generate at least a second pulse sub-sequence comprising a number of refocusing pulses at a second, lower flip angle; detect, by a nuclear magnetic resonance (NMR) sensor of a logging tool positioned in a wellbore formed in a subsurface formation, NMR spin-echo signals generated in response to at least the first pulse sub-sequence to acquire a first dataset of transversal NMR relaxation data; detect, by the NMR sensor, NMR spin-echo signals generated in response to at least the second pulse sub-sequence to acquire a second dataset of transversal NMR relaxation data; and determine a property of the subsurface formation based on at least the first and second datasets of transversal NMR relaxation data.

Embodiment #18: The one or more non-transitory machine-readable media of Embodiment 17, wherein the program code executable by the processor to cause the processor to determine the property of the subsurface formation comprises program code executable by the processor to cause the processor to jointly process and invert at least the first dataset of transversal NMR relaxation data and at least the second dataset of transversal NMR relaxation data.

Embodiment #19: The one or more non-transitory machine-readable media of any one of Embodiments 17-18, wherein the program code comprises program code executable by the processor to cause the processor to select the second, lower flip angle based on a lateral motion parameter of the NMR sensor.

Embodiment #20: The one or more non-transitory machine-readable media of any one of Embodiments 17-19, wherein the program code comprises program code executable by the processor to cause the processor to emit at least the first pulse sub-sequence and at least the second pulse sub-sequence, wherein each of the at least the first pulse sub-sequence and at least the second pulse sub-sequence comprise at least one CPMG pulse sequence, and wherein the at least the first pulse sub-sequence and at least the second pulse sub-sequence represent parts of an overall pulse sequence.

The invention claimed is:
1. A method comprising:
    determining at least one of a mean value of motion noise in a simulated signal and a standard deviation of the motion noise in the simulated signal;
    generating at least a first pulse sub-sequence comprising a number of refocusing pulses at a first flip angle;
    generating at least a second pulse sub-sequence comprising a number of refocusing pulses at a second flip angle that is lower than the first flip angle, wherein the second flip angle is selected based on at least one of the mean value and standard deviation of the motion noise of the simulated signal to reduce a lateral motion effect on acquired transversal NMR relaxation data;
    detecting, by a nuclear magnetic resonance (NMR) sensor of a logging tool positioned in a wellbore formed in a subsurface formation, NMR spin-echo signals generated in response to at least the first pulse sub-sequence to acquire a first dataset of transversal NMR relaxation data;
    detecting, by the NMR sensor, NMR spin-echo signals generated in response to at least the second pulse sub-sequence to acquire a second dataset of transversal NMR relaxation data; and
    determining a property of the subsurface formation based on the first and second datasets of transversal NMR relaxation data.

2. The method of claim 1, wherein the determining the property of the subsurface formation comprises jointly processing and inverting at least the first dataset of transversal NMR relaxation data and at least the second dataset of transversal NMR relaxation data.

3. The method of claim 1, wherein the second flip angle is selected based, at least in part, on a lateral motion parameter of the NMR sensor, and wherein the second flip angle is used to acquire longer components of a transversal NMR relaxation data spectrum.

4. The method of claim 1, wherein generating the at least first pulse sub-sequence further comprises:
    emitting an excitation pulse at a tip angle into the subsurface formation; and
    emitting the number of refocusing pulses at the first flip angle into the subsurface formation.

5. The method of claim 1, wherein generating the at least second pulse sub-sequence further comprises:
    emitting an excitation pulse at a tip angle into the subsurface formation; and emitting the number of refocusing pulses at the second flip angle into the subsurface formation.

6. The method of claim 1, wherein the at least first pulse sub-sequence is at least one Carr Purcell Meiboom Gill (CPMG) pulse sequence and the at least second pulse sub-sequence is at least one Carr Purcell Meiboom Gill (CPMG) pulse sequence, and wherein the at least first pulse sub-sequence and the at least second pulse sub-sequence are parts of an overall pulse sequence.

7. The method of claim 1, wherein the mean value of the motion noise is determined by multiplying $$\frac{1}{\pi} \cdot \frac{d_{max}}{\sqrt{3}} \cdot \frac{1}{k_{SV}} \cdot \frac{\beta}{\pi}$$

where dmax is a maximum possible lateral displacement of the NMR sensor, β is a flip angle of a refocusing pulse, and ksv is an effective thickness of a sensitivity volume when β=180 degrees.

8. A system comprising:
a downhole tool to be conveyed in a wellbore formed in a subsurface formation, wherein the downhole tool comprises,
  a transmitter to emit into the subsurface formation at least a first pulse sub-sequence and second pulse sub-sequence; and
  a nuclear magnetic resonance (NMR) sensor to detect at least a first transversal NMR relaxation dataset and at least a second transversal NMR relaxation dataset generated in response to emission of at least the first and second pulse sub-sequences;
a processor; and
a machine-readable medium having program code executable by the processor to cause the processor to,
  determine at least one of a mean value of motion noise in a simulated signal and a standard deviation of the motion noise in the simulated signal;
  generate at least the first pulse sub-sequence comprising a number of refocusing pulses at a first flip angle;
  generate at least the second pulse sub-sequence comprising a number of refocusing pulses at a second flip angle that is lower than the first flip angle, wherein the second flip angle is selected based on at least one of the mean value and standard deviation of the motion noise of the simulated signal to reduce a lateral motion effect on acquired transversal NMR relaxation data;
  detect, by the NMR sensor, NMR spin-echo signals generated in response to at least the first pulse sub-sequence to acquire the first transversal NMR relaxation dataset;
  detect, by the NMR sensor, NMR spin-echo signals generated in response to at least the second pulse sub-sequence to acquire the second transversal NMR relaxation dataset; and
  determine a property of the subsurface formation based on at least the first and second transversal NMR relaxation datasets.

9. The system of claim 8, wherein the program code executable by the processor to cause the processor to determine the property of the subsurface formation comprises program code executable by the processor to cause the processor to jointly process and invert at least the first transversal NMR relaxation dataset and at least the second transversal NMR relaxation dataset.

10. The system of claim 8,
wherein the program code comprises program code executable by the processor to cause the processor to select the second flip angle based on a lateral motion parameter of the NMR sensor.

11. The system of claim 10, further comprising:
a stabilizer coupled to the downhole tool and to laterally move within the wellbore during a downhole operation,
wherein the lateral motion parameter is a maximum possible amplitude of a lateral displacement of the NMR sensor,
wherein the program code comprises program code executable by the processor to cause the processor to determine the maximum possible amplitude of the lateral displacement of the NMR sensor based on a gauge of the stabilizer, and
wherein the program code to determine the maximum possible amplitude of the lateral displacement of the NMR sensor based on the gauge of the stabilizer comprises program code executable by the processor to cause the processor to determine a lateral motion error based on the maximum possible amplitude of the lateral displacement of the NMR sensor.

12. The system of claim 11,
wherein the program code to determine the lateral motion error comprises program code executable by the processor to cause the processor to select the second flip angle based on the lateral motion error.

13. The system of claim 8, wherein the program code to generate at least the first pulse sub-sequence further comprises program code executable by the processor to cause the processor to:
  emit an excitation pulse at a tip angle into the subsurface formation; and
  emit the number of refocusing pulses at the first flip angle into the subsurface formation.

14. The system of claim 8, wherein the program code to generate at least the second pulse sub-sequence further comprises program code executable by the processor to cause the processor to:
  emit an excitation pulse at a tip angle into the subsurface formation; and
  emit the number of refocusing pulses at the second flip angle into the subsurface formation.

15. The system of claim 8, wherein the mean value of the motion noise is determined by multiplying $$\frac{1}{\pi} \cdot \frac{d_{max}}{\sqrt{3}} \cdot \frac{1}{k_{SV}} \cdot \frac{\beta}{\pi}$$

where dmax is a maximum possible lateral displacement of the NMR sensor, β is a flip angle of a refocusing pulse, and ksv is an effective thickness of a sensitivity volume when β=180 degrees.

16. One or more non-transitory machine-readable media comprising program code executable by a processor to cause the processor to:
  determine at least one of a mean value of motion noise in a simulated signal and a standard deviation of the motion noise in the simulated signal;
  generate at least a first pulse sub-sequence comprising a number of refocusing pulses at a first flip angle;
  generate at least a second pulse sub-sequence comprising a number of refocusing pulses at a second flip angle that is lower than the first flip angle, wherein the second flip angle is selected based on at least one of the mean value and standard deviation of the motion noise of the simulated signal to reduce a lateral motion effect on acquired transversal NMR relaxation data;

detect, by a nuclear magnetic resonance (NMR) sensor of a logging tool positioned in a wellbore formed in a subsurface formation, NMR spin-echo signals generated in response to at least the first pulse sub-sequence to acquire a first dataset of transversal NMR relaxation data;

detect, by the NMR sensor, NMR spin-echo signals generated in response to at least the second pulse sub-sequence to acquire a second dataset of transversal NMR relaxation data; and determine a property of the subsurface formation based on at least the first and second datasets of transversal NMR relaxation data.

17. The one or more non-transitory machine-readable media of claim 16, wherein the program code executable by the processor to cause the processor to determine the property of the subsurface formation comprises program code executable by the processor to cause the processor to jointly process and invert at least the first dataset of transversal NMR relaxation data and at least the second dataset of transversal NMR relaxation data.

18. The one or more non-transitory machine-readable media of claim 16, wherein the program code comprises program code executable by the processor to cause the processor to select the second flip angle based on a lateral motion parameter of the NMR sensor.

19. The one or more non-transitory machine-readable media of claim 16, wherein the program code comprises program code executable by the processor to cause the processor to emit at least the first pulse sub-sequence and at least the second pulse sub-sequence, wherein each of the at least the first pulse sub-sequence and at least the second pulse sub-sequence comprise at least one CPMG pulse sequence, and wherein the at least the first pulse sub-sequence and at least the second pulse sub-sequence represent parts of an overall pulse sequence.

20. The one or more non-transitory machine-readable media of claim 16, wherein the mean value of the motion noise is determined by multiplying $$\frac{1}{\pi} \cdot \frac{d_{max}}{\sqrt{3}} \cdot \frac{1}{k_{SV}} \cdot \frac{\beta}{\pi}$$

where dmax is a maximum possible lateral displacement of the NMR sensor, $\beta$ is a flip angle of a refocusing pulse, and ksv is an effective thickness of a sensitivity volume when $\beta=180$ degrees.

* * * * *